United States Patent
Hamaya (10) Patent No.: US 8,330,585 B2
(45) Date of Patent: Dec. 11, 2012

(54) POWER SUPPLY EMPLOYING PULSE-WIDTH MODULATION AND DIGITAL-TO-ANALOG CONVERTER, POWER SUPPLY CONTROL DEVICE, AND MANUFACTURING METHOD OF THE SAME

(75) Inventor: Masahito Hamaya, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 776 days.

(21) Appl. No.: 12/549,282

(22) Filed: Aug. 27, 2009

(65) Prior Publication Data

US 2010/0052873 A1 Mar. 4, 2010

(30) Foreign Application Priority Data

Aug. 29, 2008 (JP) ................................ 2008-222046
Aug. 19, 2009 (JP) ................................ 2009-189807

(51) Int. Cl.
*G05B 11/01* (2006.01)
*G08C 19/16* (2006.01)

(52) U.S. Cl. .......... 340/12.32; 340/13.23; 307/4; 307/3; 709/225; 310/10; 381/120

(58) Field of Classification Search ............... 340/12.32, 340/13.23, 288; 307/4, 3; 709/225; 330/10, 330/251; 381/120, 94.1; 375/220
See application file for complete search history.

(56) References Cited

U.S. PATENT DOCUMENTS

| 6,517,120 | B1 | 2/2003 | Miyajima et al. |
| 6,989,734 | B2 * | 1/2006 | Thomas ........................ 375/258 |
| 8,139,792 | B2 * | 3/2012 | Magrath ....................... 381/120 |
| 2004/0153543 | A1 * | 8/2004 | Thomas ........................ 709/225 |
| 2005/0184895 | A1 * | 8/2005 | Petersen et al. ............... 341/143 |
| 2006/0082220 | A1 * | 4/2006 | Karam et al. ..................... 307/4 |
| 2008/0192509 | A1 * | 8/2008 | Dhuyvetter et al. ........... 363/17 |

FOREIGN PATENT DOCUMENTS

| JP | H10-327536 A | 12/1998 |
| JP | 2001-160832 A | 6/2001 |
| JP | 2002-013684 A | 1/2002 |
| JP | 2003-298423 A | 10/2003 |
| JP | 2005-010450 A | 1/2005 |

* cited by examiner

*Primary Examiner* — Hoi Lau
(74) *Attorney, Agent, or Firm* — Baker Botts L.L.P.

(57) ABSTRACT

A power supply for supplying electric power comprises a power circuit which supplies L channels of electric power (L: positive integer), a control circuit board which outputs multiple types of control signals including a digital control signal and a PWM signal, a digital-to-analog converter having M channels (M: positive integer less than L) each of which converts the digital control signal into an analog control signal, and N demodulation circuits (N=L−M) each of which generates an analog control signal by demodulating the PWM signal. The control circuit board is electrically connected to the power circuit via the M channels of the digital-to-analog converter and the N demodulation circuits. N is a positive integer not more than M.

16 Claims, 8 Drawing Sheets

POWER SUPPLY EMPLOYING PULSE-WIDTH MODULATION AND DIGITAL-TO-ANALOG CONVERTER, POWER SUPPLY CONTROL DEVICE, AND MANUFACTURING METHOD OF THE SAME

CROSS-REFERENCE TO RELATED APPLICATION

This application claims priority under 35 U.S.C. §119 from Japanese Patent Applications No. 2008-222046 filed on Aug. 29, 2008, and No. 2009-189807 filed on Aug. 19, 2009. The entire subject matters of the applications are incorporated herein by reference.

BACKGROUND

1. Technical Field

The present invention relates to a power supply employing pulse-width modulation and a digital-to-analog converter, a power supply control device, and a manufacturing method of the power supply.

2. Related Art

An image formation device for forming an image on a print medium (e.g. paper) uses electric power of various voltages for various processes (steps) such as exposure, development, image transfer and fixation. Such a variety of electric power is supplied from a high-voltage power supply to the various processes stably as analog outputs controlled according to analog control signals. Each analog control signal can be generated by means of pulse-width modulation (PWM) or a digital-to-analog converter according to a digital control signal which is supplied from a control circuit board having a CPU.

However, there has been conducted no detailed examination on how to properly control multiple channels of electric power by selectively and appropriately using such various types of analog control signal generating methods. This kind of problem is not restricted to image formation devices but is a general problem common to electric power control for controlling the supply of multiple channels of electric power.

SUMMARY OF THE INVENTION

The present invention, which has been made in consideration of the above problem, is advantageous in that a technology for power supply control, making it possible to properly supply multiple channels of electric power by selectively and appropriately using multiple types of analog control signal generating methods, can be provided.

In accordance with an aspect of the present invention, there is provided a power supply for supplying electric power, comprising a power circuit which supplies L channels of electric power (L: positive integer), a control circuit board which outputs multiple types of control signals including a digital control signal and a PWM signal, a digital-to-analog converter having M channels (M: positive integer less than L) each of which converts the digital control signal into an analog control signal, and N demodulation circuits (N=L−M) each of which generates an analog control signal by demodulating the PWM signal. The control circuit board is electrically connected to the power circuit via the M channels of the digital-to-analog converter and the N demodulation circuits. N is a positive integer not more than M.

In accordance with another aspect of the present invention, there is provided a power supply control device which controls a power circuit which supplies L channels of electric power (L: positive integer). The power supply control device comprises a control circuit board which outputs multiple types of control signals including a digital control signal and a PWM signal, a digital-to-analog converter having M channels (M: positive integer less than L) each of which converts the digital control signal into an analog control signal, and N demodulation circuits (N=L−M) each of which generates an analog control signal by demodulating the PWM signal. The M channels of the digital-to-analog converter and the N demodulation circuits to be connected to the power circuit are electrically connected with the control circuit board. N is a positive integer not more than M.

In accordance with another aspect of the present invention, there is provided a manufacturing method of a power supply having a power circuit which supplies L channels of electric power (L: positive integer). The manufacturing method comprises a preparation step of preparing a control circuit board which outputs multiple types of control signals including a digital control signal and a PWM signal, a digital-to-analog converter having M channels (M: positive integer less than L) each of which converts the digital control signal into an analog control signal and N demodulation circuits (N=L−M) each of which generates an analog control signal by demodulating the PWM signal, a first connecting step of electrically connecting the M channels of the digital-to-analog converter to be connected to the power circuit with the control circuit board, and a second connecting step of electrically connecting the N demodulation circuits to be connected to the power circuit with the control circuit board. N is a positive integer not more than M.

Other objects, features and advantages of the present invention will become more apparent from the consideration of the following detailed description taken in conjunction with the accompanying drawings.

DETAILED DESCRIPTION OF THE EMBODIMENTS

Referring now to the drawings, a description will be given in detail of preferred embodiments in accordance with the present invention.

A. Overall Configuration of Image Formation Device

Figure 1:
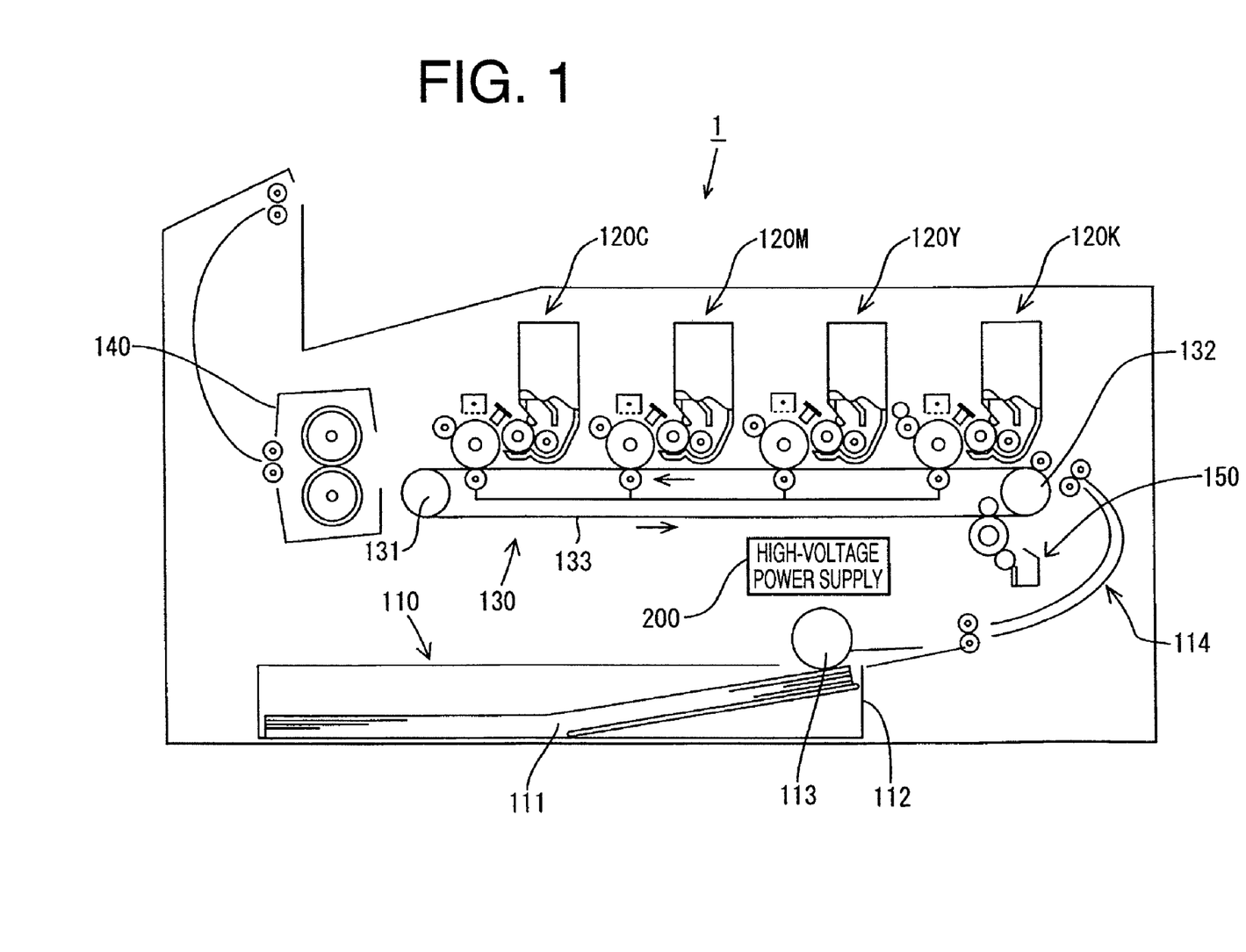
FIG. 1 is a schematic cross-sectional view showing the internal configuration of a printer (image formation device) in accordance with an embodiment of the present invention.

FIG. 1 is a schematic cross-sectional view showing the internal configuration of a printer 1 (example of an image formation device) in accordance with an embodiment of the present invention. The printer 1 in this embodiment is an electrophotographic printer which carries out the exposure process by use of light emitted from lasers, LEDs (Light-Emitting Diode), etc. and then forms an image on a print medium (e.g. paper) using toners of four colors CMYK (Cyan, Magenta, Yellow, blacK).

The printer 1 is equipped with a sheet feed unit 110, image formation units 120C, 120M, 120Y and 120K for the four colors CMYK, a feeding mechanism 130, a fixation unit 140, a belt cleaning mechanism 150 and a high-voltage power supply 200. The high-voltage power supply 200 supplies electric power of various voltages to the image formation units 120C, 120M, 120Y and 120K and components of the feeding mechanism 130 (explained later). The internal configuration of the high-voltage power supply 200 will be explained later.

The sheet feed unit 110 includes a tray 112 which stores a stack of sheets 111 (paper, OHP sheets, etc.) to be printed on, a pickup roller 113 which successively picks up (extracts) the sheets 111 from the sheet stack one by one, and a sheet supply mechanism 114 which supplies the extracted sheet 111 to the feeding mechanism 130.

The feeding mechanism 130 feeds the sheet 111 successively to the image formation unit 120K, the image formation unit 120Y, the image formation unit 120M and to the image formation unit 120C. The feeding mechanism 130 includes a drive roller 131, a driven roller 132 and a belt 133 stretched between the drive roller 131 and the driven roller 132.

B. Configuration of Image Formation Unit for Each Color

Figure 2:
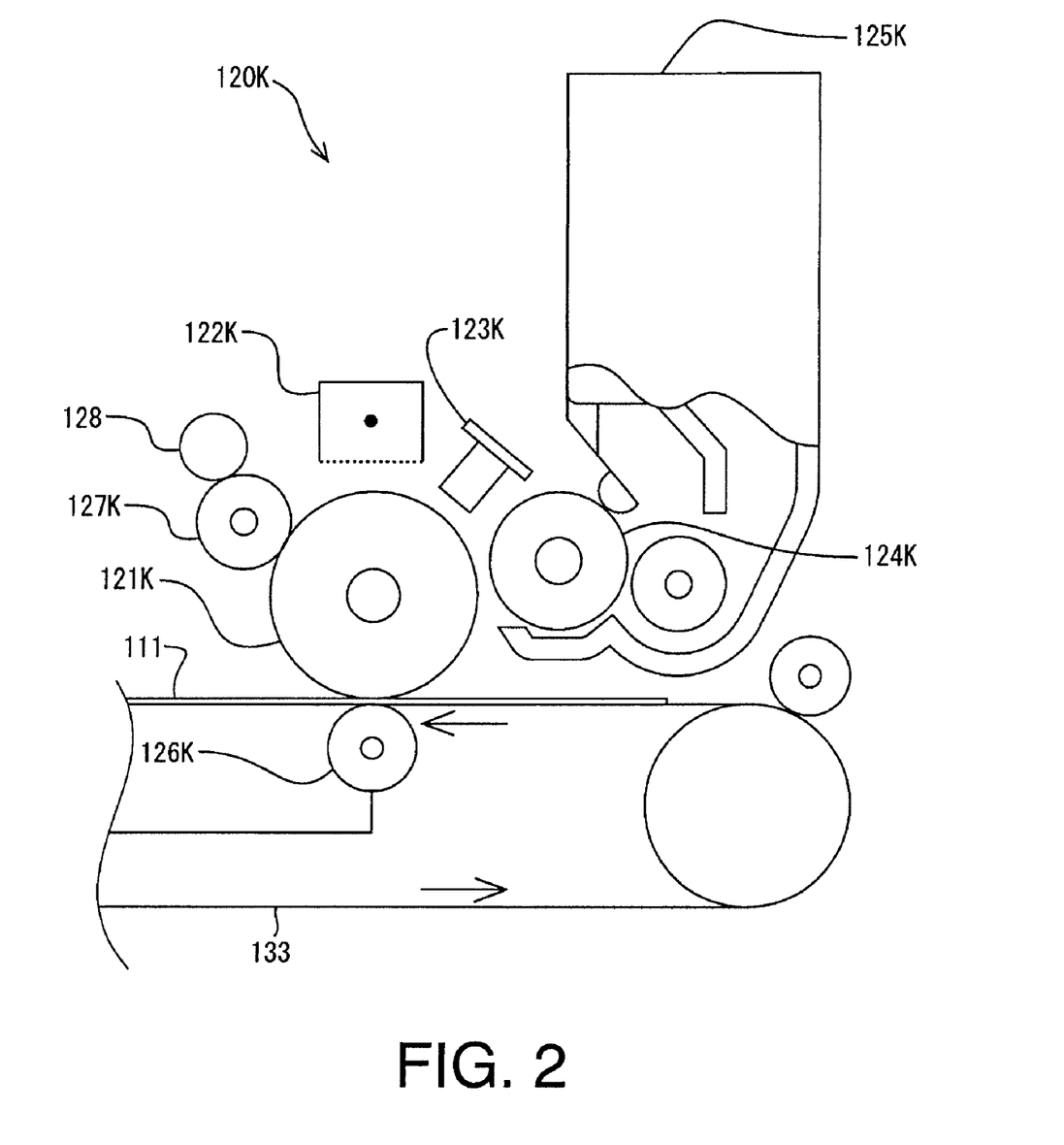
FIG. 2 is an enlarged view showing the configuration of an image formation unit of the printer.

FIG. 2 is an enlarged view showing the configuration of the image formation unit 120K of the printer 1 of this embodiment. Since the image formation units 120C, 120M, 120Y and 120K for the four colors CMYK have substantially the same configurations (except that the image formation unit 120K is additionally equipped with a collection roller 128), only the image formation unit 120K will be explained below as a typical example.

The image formation unit 120K is equipped with a photosensitive drum 121K (example of a photosensitive body), a charging unit 122K, an exposure unit 123K, a development roller 124K, a toner case 125K and a transfer roller 126K in order to execute an electrophotographic process. The image formation unit 120K is further equipped with a drum cleaning roller 127K and the collection roller 128 in order to remove paper dust (paper residue) and the toner from the photosensitive drum 121K.

The charging unit 122K is a component of the image formation unit 120K for executing a charging process to the photosensitive drum 121K. In the charging process, the surface of the photosensitive drum 121K is electrically charged by the charging unit 122K up to a positive electric potential (e.g. +700 V). The photosensitive drum 121K is frame-grounded (unshown) to a ground line (reference potential) of the printer 1.

The exposure unit 123K is a component of the image formation unit 120K for executing an exposure process to the photosensitive drum 121K. In the exposure process, an electrostatic latent image is formed on the surface of the photosensitive drum 121K by selectively diminishing the surface electric charge of the photosensitive drum 121K by use of light emitted from multiple light-emitting elements (lasers, LEDs, etc.). The formation of the electrostatic latent image is carried out by controlling the light amount of each light-emitting element according to image data for one color K (black) inputted from the outside. By this process, an electrostatic latent image is formed on the surface of the photosensitive drum 121K.

The development roller 124K is a component of the image formation unit 120K for executing a development process to the photosensitive drum 121K. In the development process, a toner image is formed on the surface of the photosensitive drum 121K. The formation of the toner image is carried out by the development roller 124K by electrically charging the black toner up to a positive electric potential (+) and supplying the charged black toner onto the photosensitive drum 121K in the form of a substantially uniform thin layer.

The transfer roller 126K is a component of the image formation unit 120K for executing an image transfer process. In the image transfer process, the toner image formed on the surface of the photosensitive drum 121K is transferred to the sheet 111 being fed on the belt 133. The transfer of the toner image is carried out by applying a transfer voltage in a polarity (−) reverse to that of the charged black toner (+) to the transfer roller 126K with respect to the photosensitive drum 121K.

When the image transfer process is finished for the black toner K through the processes described above, subsequent image transfer processes for the other toners Y (yellow), M (magenta) and C (cyan) are successively executed to the sheet 111 (having the black toner image thereon) in the same way. When the image transfer process is completed for all toners K (black), Y (yellow), M (magenta) and C (cyan), the sheet 111 is fed to the fixation unit 140 (see FIG. 1) for a fixation process.

The fixation unit 140 executes the fixation process by heat-fixing the (multicolor) toner image on the sheet 111. When the heat fixing is finished, the sheet 111 is ejected onto the top of the printer 1, by which the printing is completed.

C. Configuration of Belt Cleaning Mechanism

Figure 3:
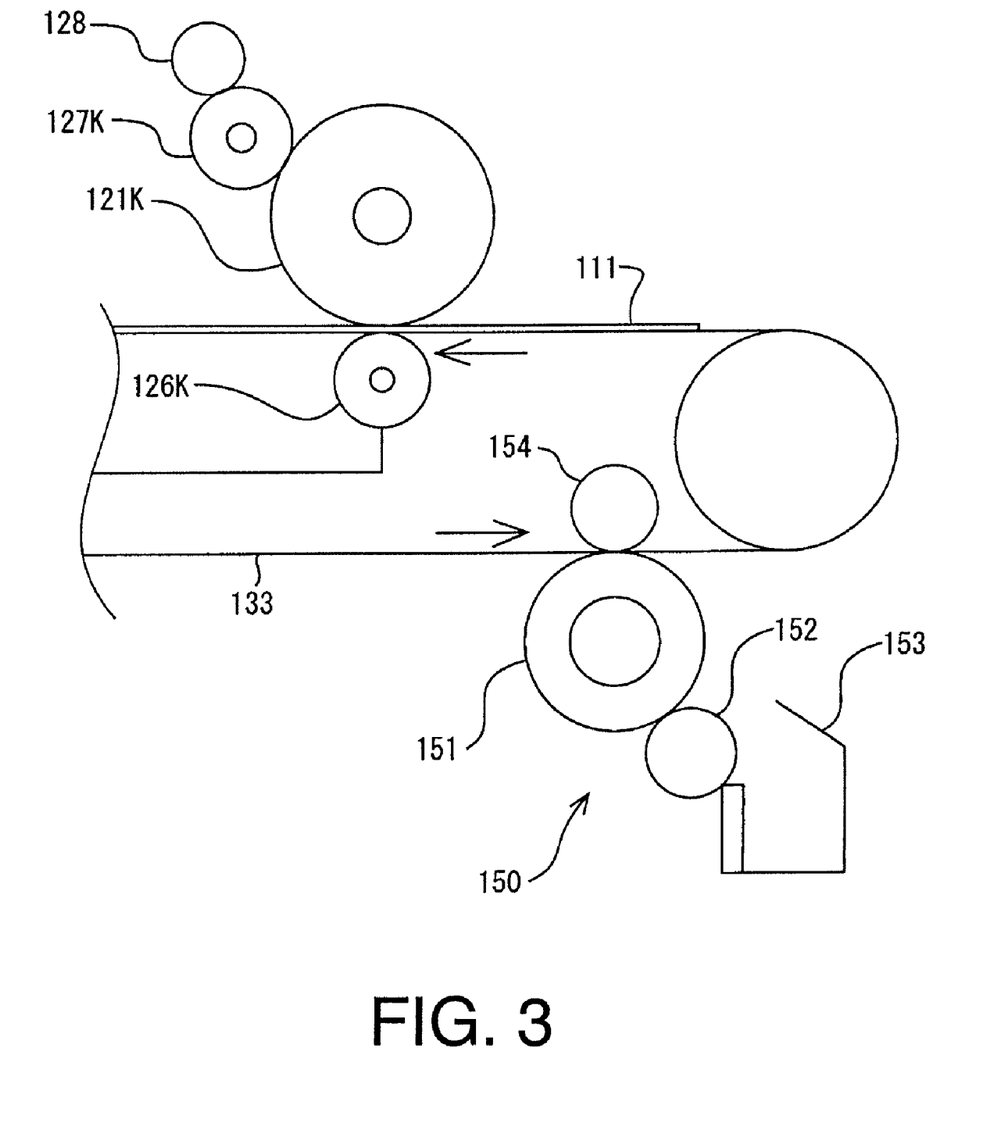
FIG. 3 is an enlarged view showing the configuration of a belt cleaning mechanism and a drum cleaning mechanism of the printer.

FIG. 3 is an enlarged view showing the configuration of the belt cleaning mechanism 150 and a drum cleaning mechanism of the printer 1 of this embodiment. In FIG. 3, the drum cleaning roller 127K and the collection roller 128 of the image formation unit 120K and the belt cleaning mechanism 150 are shown. While the other image formation units 120M, 120C and 120Y are similarly equipped with the drum cleaning rollers 127M, 127C and 127Y, respectively, the image formation units 120M, 120C and 120Y do not include components corresponding to the collection roller 128 or the belt cleaning mechanism 150.

The belt cleaning mechanism 150 is a cleaning mechanism which removes deposits (toners) on the belt 133 by attracting the deposits by electrostatic force. The belt cleaning mechanism 150 includes a belt cleaning roller 151 which removes the deposits from the belt 133, a collection roller 152 which collects the removed deposits from the belt cleaning roller 151, a reservoir box 153 which scrapes the collected deposits off the collection roller 152 and stores the deposits, and a backup roller 154 which is placed to face the belt cleaning roller 151 across the belt 133.

The belt cleaning roller 151 (with a foamed material on its surface, for example) is driven and rotated in a direction opposite to the moving direction of the belt 133 so that its surface slides on the belt 133 while contacting the belt 133. Since an electric potential (e.g. −1200 V with respect to the reference potential) in a polarity (−) reverse to that of the deposits (+) is applied to the belt cleaning roller 151, the deposits adhering to the belt 133 can be attracted to the belt cleaning roller 151 with the electrostatic force and removed from the belt 133.

The collection roller 152 (made of metal, for example) is placed to keep contact with the belt cleaning roller 151. Since the collection roller 152 is electrically charged at an appropriate electric potential (e.g. −1600 V with respect to the reference potential) so that its potential difference (absolute value) from the deposits is larger than that of the belt cleaning roller 151, the collection roller 152 is capable of collecting the deposits already attracted and adhering to the belt cleaning roller 151.

As above, stepwise electric potentials (different from each other) are applied to the belt cleaning roller 151 and the collection roller 152.

On the other hand, the drum cleaning mechanism (127K, 128) in this embodiment is a cleaning mechanism which removes deposits (toner, paper dust, etc.) on the photosensitive drum 121K by attracting the deposits by electrostatic force. The drum cleaning mechanism (127K, 128), which is configured similarly to the belt cleaning mechanism 150, includes the drum cleaning roller 127K, the collection roller 128 and a reservoir box (unshown).

The drum cleaning mechanism (127K, 128) has two operation modes: a toner removing mode for removing the toner in the positive polarity and a paper dust removing mode for removing the paper dust in the negative polarity. The toner removing mode is enabled during the printing, while the paper dust removing mode is enabled after finishing a print job or after printing on a prescribed number of sheets.

The toner removing mode is an operation mode for removing the toner (having the positive polarity) from the photosensitive drum 121K. In the toner removing mode, an electric potential (e.g. −400 V with respect to the reference potential) in a polarity (−) reverse to that of the toner (+) is applied to the drum cleaning roller 127K in order to remove the toner (+) from the photosensitive drum 121K. At this time, the collection roller 128 is kept at an electric potential (e.g. −300 V with respect to the reference potential) higher than that of the drum cleaning roller 127K. Thus, the toner (+) removed from the photosensitive drum 121K by the drum cleaning roller 127K remains on the drum cleaning roller 127K without being collected by the collection roller 128.

The paper dust removing mode is an operation mode for removing the paper dust (having the negative polarity) from the photosensitive drum 121K. In the paper dust removing mode, an electric potential (e.g. 600 V with respect to the reference potential) in a polarity (+) reverse to that of the paper dust (−) is applied to the drum cleaning roller 127K. At this time, the collection roller 128 is kept at an appropriate electric potential (e.g. 700 V with respect to the reference potential) so that its potential difference from the paper dust is larger than that of the drum cleaning roller 127K, by which the collection roller 128 is enabled to collect the paper dust already attracted and adhering to the drum cleaning roller 127K.

In the paper dust removing mode, the toner (having the positive polarity) on the drum cleaning roller 127K is returned to the photosensitive drum 121K and thereafter collected by the belt cleaning mechanism 150 via the belt 133.

As above, stepwise positive electric potentials (different from each other) have to be applied to the drum cleaning roller 127K and the collection roller 128 in the paper dust removing mode, while stepwise negative electric potentials (different from each other) have to be applied to the drum cleaning roller 127K and the collection roller 128 in the toner removing mode.

D. Configuration of Power Supply as Comparative Example

Figure 4:
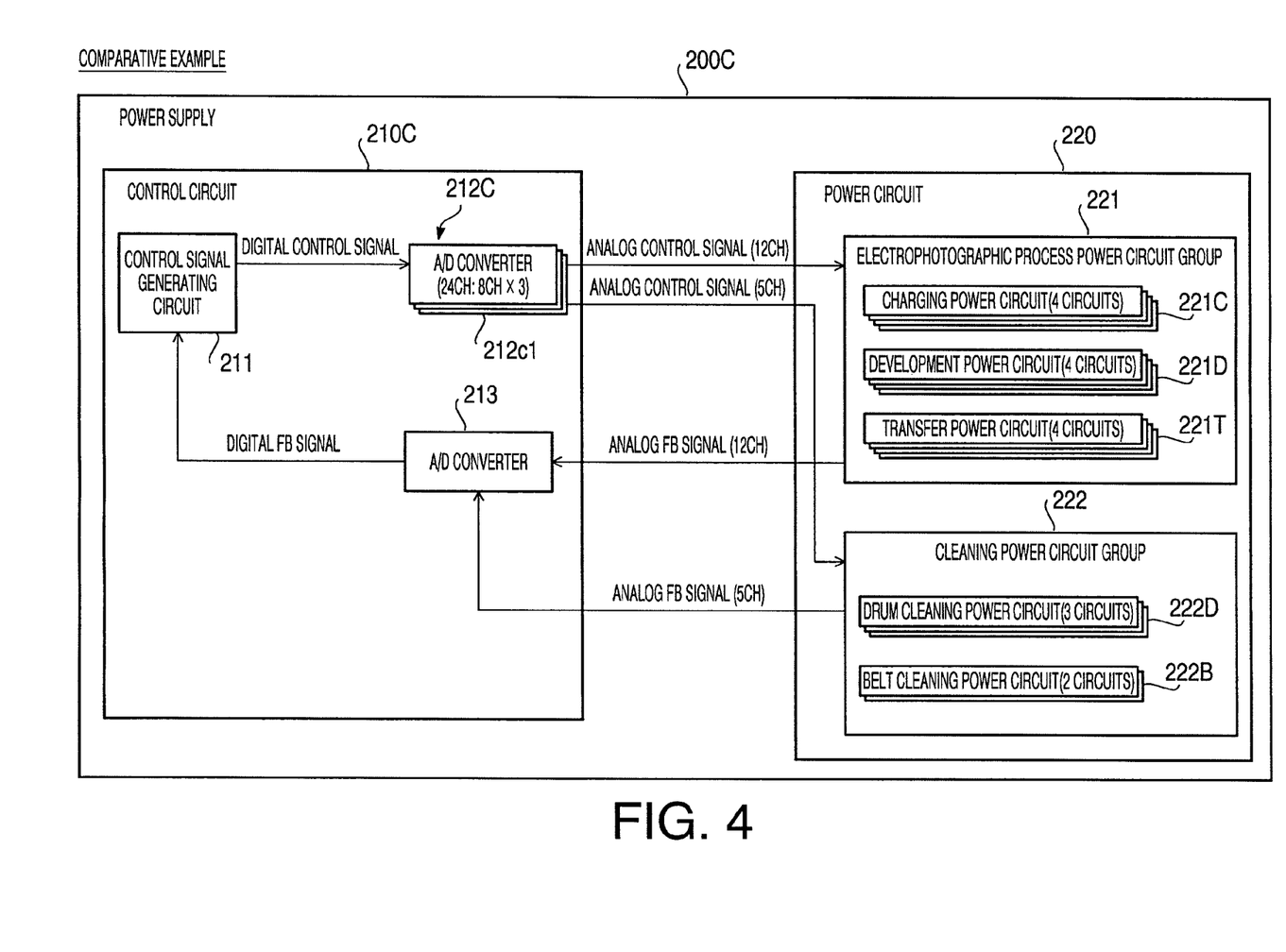
FIG. 4 is a block diagram showing the configuration of a high-voltage power supply as a comparative example.

FIG. 4 is a block diagram showing the configuration of a high-voltage power supply 200C as a comparative example. The high-voltage power supply 200C includes a power circuit 220 which generates electric power to be supplied for the aforementioned processes and cleaning and a control circuit 210C which controls the power circuit 220.

The power circuit 220 includes an electrophotographic process power circuit group 221 and a cleaning power circuit group 222. The electrophotographic process power circuit group 221 is a group of power circuits for generating high electric potentials to be used for electrophotographic processes such as the charging process, the development process and the image transfer process. The cleaning power circuit group 222 is a group of power circuits for generating high electric potentials to be used for cleaning-related processes executed by the drum cleaning roller 127K, the collection roller 128, the belt cleaning mechanism 150, etc.

The electrophotographic process power circuit group 221 includes four charging power circuits 221C, four development power circuits 221D and four transfer power circuits 221T. The four charging power circuits 221C supply electric power to the charging units 122C, 122M, 122Y and 122K, respectively. The four development power circuits 221D supply electric power to the development roller 124C, 124M, 124Y and 124K, respectively. The four transfer power circuits 221T supply electric power to the transfer rollers 126C, 126M, 126Y and 126K, respectively.

Figure 5:
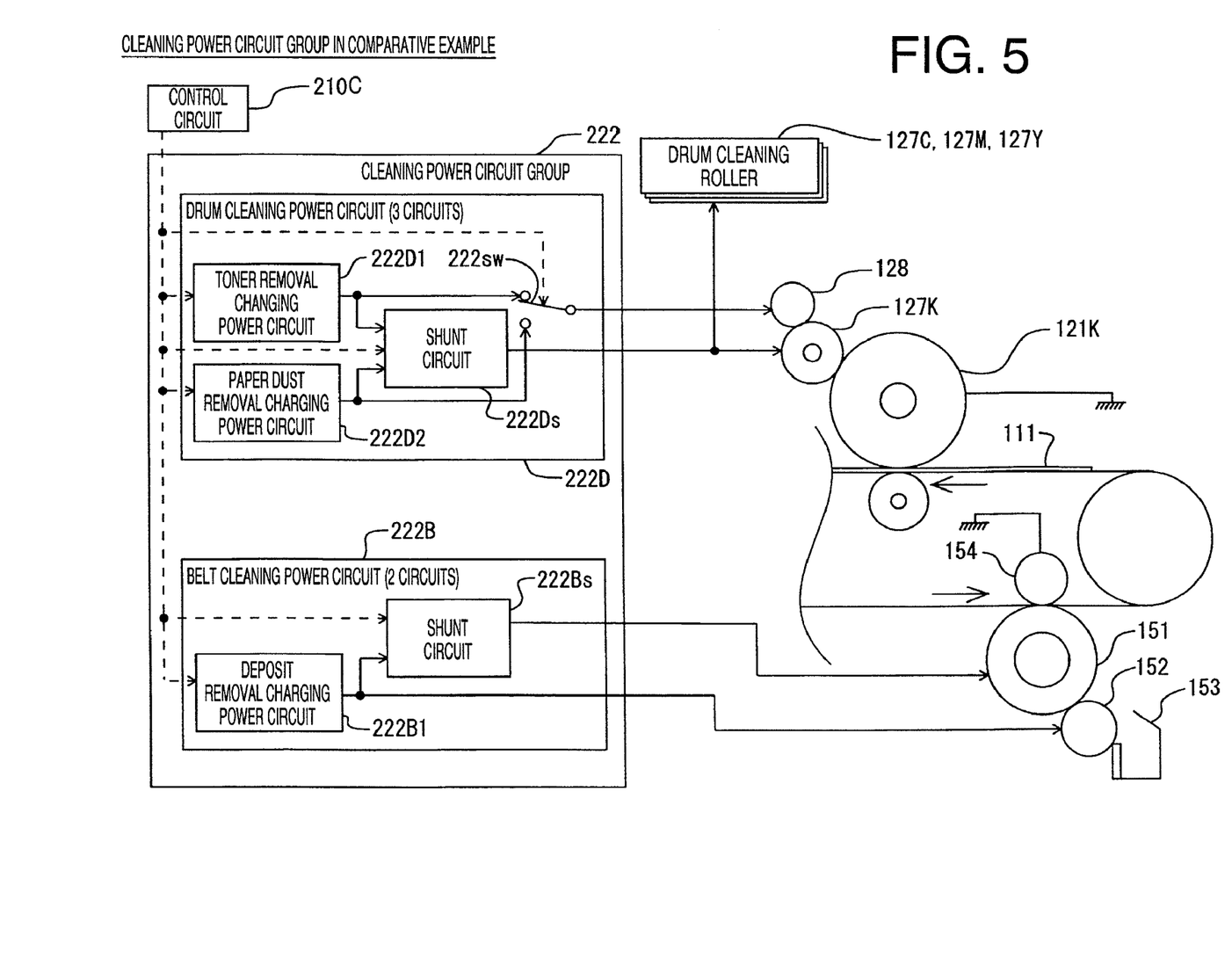
FIG. 5 is a schematic diagram showing the configuration of a cleaning power circuit group of the high-voltage power supply as the comparative example.

FIG. 5 is a schematic diagram showing the configuration of the cleaning power circuit group 222 of the high-voltage power supply 200C as the comparative example. The cleaning power circuit group 222 includes a belt cleaning power circuit 222B and a drum cleaning power circuit 222D. The belt cleaning power circuit 222B includes a deposit removal charging power circuit 222B1 which supplies electric power to the collection roller 152 and a shunt circuit 222Bs which supplies electric power to the belt cleaning roller 151. Incidentally, the photosensitive drum 121K and the backup roller 154 are frame-grounded.

The shunt circuit 222Bs is used for supplying the electric power to the belt cleaning roller 151 so that the electric potential applied to the belt cleaning roller 151 by the shunt circuit 222Bs is generated as an intermediate electric potential. The intermediate electric potential is applied to the belt cleaning roller 151 since the stepwise electric potentials of the belt cleaning roller 151 and the collection roller 152 are required for collecting the deposits adhering to the belt 133 and then transferring the deposits to the collection roller 152 via the belt cleaning roller 151.

Incidentally, it is difficult to request high performance in regard to required power supply specifications (high accuracy, high response, wide dynamic range, etc.) from the shunt circuit 222Bs due to characteristics of the shunt circuit. However, such high performance (regarding the required power supply specifications) is not required of the shunt circuit 222Bs since the application of the electric potential to the belt cleaning roller 151 is just for the purpose of removing the deposits. Further, the use of the shunt circuit 222Bs has advantages in that a shunt circuit can be formed with ease and is suitable for generating an intermediate electric potential as mentioned above.

The drum cleaning power circuit 222D includes a paper dust removal charging power circuit 222D2 and a shunt circuit 222Ds which supply electric power for the removal of the paper dust (in the paper dust removing mode) to the collection roller 128 and the drum cleaning roller 127K, respectively.

The drum cleaning power circuit 222D (including the paper dust removal charging power circuit 222D2 and the shunt circuit 222Ds) is designed under basically the same concept as that for the belt cleaning power circuit 222B.

However, the drum cleaning power circuit 222D further includes a toner removal charging power circuit 222D1 (for the toner removing mode) which supplies electric power for the removal of the toners to the collection roller 128. The toner removal charging power circuit 222D1 and the paper dust removal charging power circuit 222D2 are connected to a switch 222sw so that the switching between the circuits 222D1 and 222D2 is possible. The shunt circuit 222Ds, which is connected not only to the drum cleaning roller 127K but also to the drum cleaning rollers 127C, 127M and 127Y in parallel, supplies the toner removing electric power also to the drum cleaning rollers 127C, 127M and 127Y.

Incidentally, the toner removal charging power circuit 222D1 and the paper dust removal charging power circuit 222D2 are designed as circuits having the same configuration except for the polarity (positive/negative) in order to simplify the circuit design.

On the other hand, the control circuit 210C of the high-voltage power supply 200C as the comparative example (see FIG. 4) has the following configuration in order to properly control the aforementioned circuits (targets of control). The control circuit 210C includes a control signal generating circuit 211, a digital-to-analog converter 212C (represented also as "D/A converter") and an analog-to-digital converter 213 (represented also as "A/D converter").

Incidentally, FIG. 4 (drawn as a functional block diagram) does not indicate the actual implementation of the high-voltage power supply 200C (control circuit 210C, power circuit 220). Especially, the digital-to-analog converter 212C is desired to be mounted on the same circuit board (unshown) as the power circuit 220 in the actual implementation from the viewpoint of preventing noise getting into analog signals (see FIG. 4).

The control signal generating circuit 211 is configured as a control circuit equipped with a CPU (unshown). The control signal generating circuit 211 outputs a digital control signal in response to a digital feedback signal (represented also as "digital FB signal") according to preset control rules. The digital feedback signal is generated by the analog-to-digital converter 213 by executing analog-to-digital conversion to analog feedback signals (represented also as "analog FB signals") supplied from the power circuit 220. The digital control signal outputted by the control signal generating circuit 211 is D/A converted by the digital-to-analog converter 212C into analog control signals (17 channels) and thereafter supplied to the power circuit 220.

The digital-to-analog converter 212C is equipped with three 8-channel digital-to-analog converter chips 212c1, each having eight digital-to-analog conversion circuits, and is capable of executing 24-channel digital-to-analog conversion. The digital-to-analog converter 212C outputs seventeen channels of analog control signals in total. The seventeen channels of analog control signals are composed of twelve channels of analog control signals for controlling the electrophotographic process power circuit group 221 and five channels of analog control signals for controlling the cleaning power circuit group 222.

As above, even though the digital-to-analog converter 212C is capable of executing the 24-channel digital-to-analog conversion, only seventeen channels are used and the remaining seven channels are unused and wasted. On the other hand, if one of the three 8-channel digital-to-analog converter chips 212c1 is removed, the digital-to-analog converter 212C lacks one channel.

This kind of problem has hindered efficient use of circuit resources in the use of multiple-channel digital-to-analog converters. The problem can be resolved by the following embodiments:

E. Configuration of Power Supply in Accordance with First Embodiment

Figure 6:
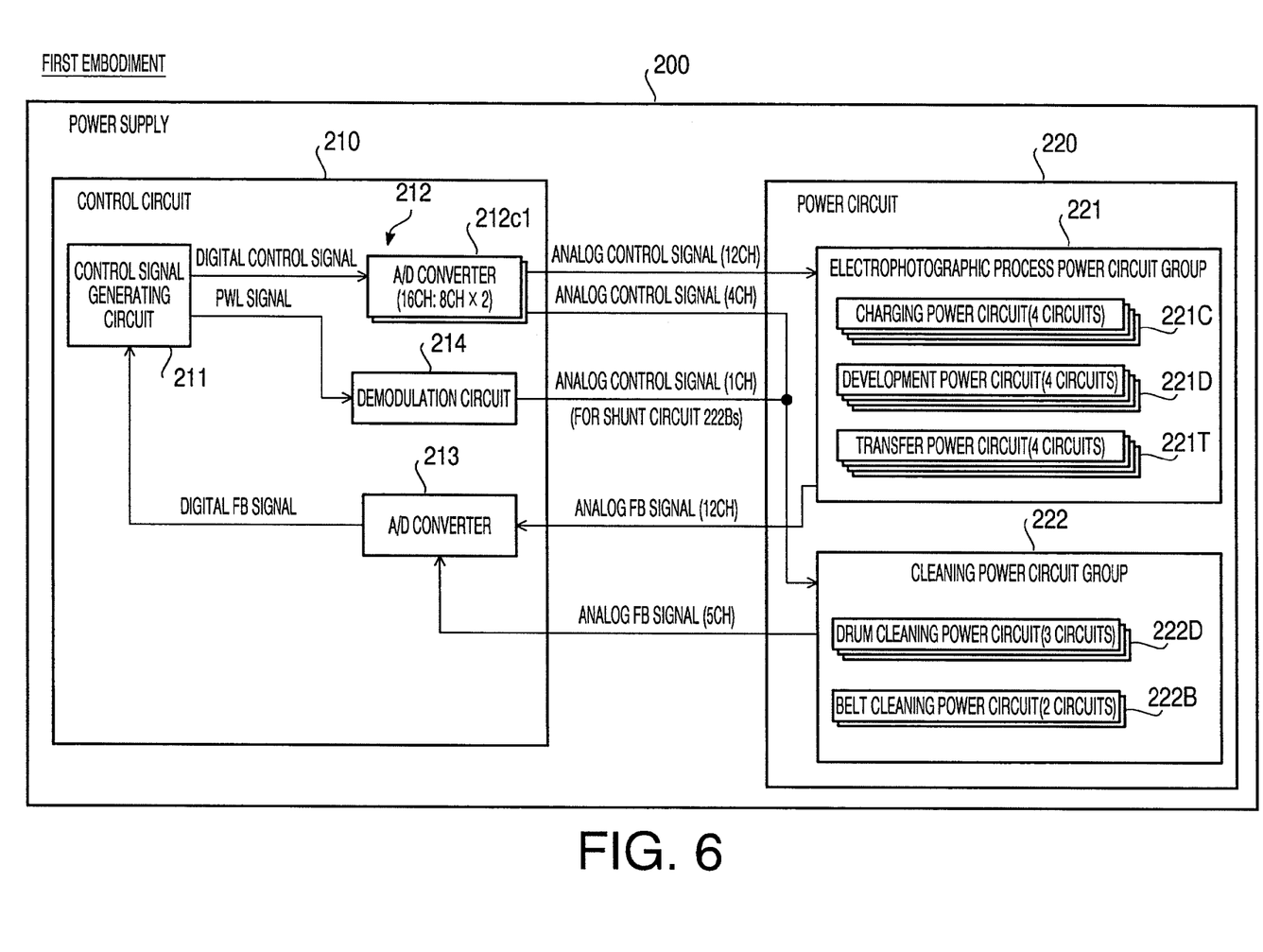
FIG. 6 is a block diagram showing the configuration of a high-voltage power supply in accordance with a first embodiment of the present invention.

FIG. 6 is a block diagram showing the configuration of the high-voltage power supply 200 in accordance with a first embodiment of the present invention. The high-voltage power supply 200 (first embodiment) differs from the high-voltage power supply 200C (comparative example) in that the 24-channel digital-to-analog converter 212C shown in FIG. 4 (including three 8-channel digital-to-analog converter chips 212c1) has been replaced with a 16-channel digital-to-analog converter 212 (including two 8-channel digital-to-analog converter chips 212c1) and a demodulation circuit 214.

In the digital-to-analog converter 212 in this embodiment, the number of channels has been reduced from 24 to 16 by removing one 8-channel digital-to-analog converter chip 212c1 from the digital-to-analog converter 212C (comparative example) having three 8-channel digital-to-analog converter chips 212c1. The remaining one channel (which can not be processed by the digital-to-analog converter 212 due to the reduction of channels) is processed by the demodulation circuit 214.

The demodulation circuit 214 is configured as a lowpass filter for smoothing a PWM (Pulse-Width Modulation) signal outputted from the control signal generating circuit 211. In this embodiment, the operation of the control signal generating circuit 211 slightly differs from that in the comparative example in that the control signal generating circuit 211 outputs the control signal (which was outputted as the digital control signal in the comparative example) also in the form of the PWM signal. With such a configuration, all the channels of the two 8-channel digital-to-analog converter chips 212c1 can be used efficiently (fully) without wasting any of the channels.

The PWM signal is a signal which is generated by modulating a voltage signal into pulse widths as a digital control signal. Since the modulation is executed by a modulation circuit such as a PWM comparator (unshown), signal delay is caused by response delay of the PWM comparator. Further, the demodulation circuit 214 (configured as a lowpass filter) causes time delay (e.g. phase delay). As above, the use of the PWM signal involves the problem of response delay which is caused by processes like modulation and demodulation.

However, the present inventor has configured the high-voltage power supply 200 with substantially no performance deterioration from the high-voltage power supply 200C (comparative example), by using the PWM signal for the shunt circuit 222Bs (see FIG. 5) as one of the three circuits included in the cleaning power circuit group 222. The "substantially no performance deterioration" is realized since requirements regarding the response delay (as the required power supply specifications) can be well satisfied in the cleaning power circuit group 222 even with the use of the PWM signal.

As above, the high-voltage power supply 200 of this embodiment realizes the high-voltage power supply control while making full use of the channels of the two 8-channel digital-to-analog converter chips 212c1 (without wasting any of the channels), with substantially no performance deterioration.

Figure 7:
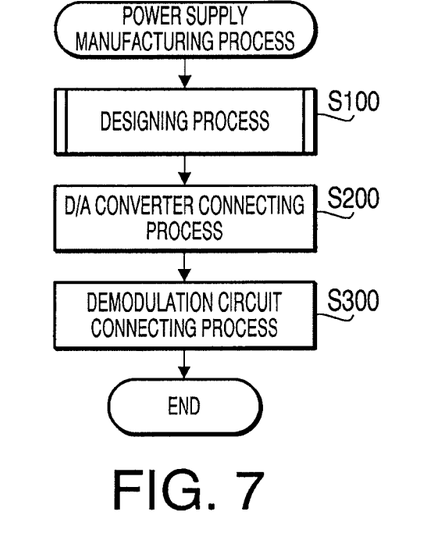
FIG. 7 is a flow chart showing a method of manufacturing the high-voltage power supply in accordance with the first embodiment.

FIG. 7 is a flow chart showing a method of manufacturing the high-voltage power supply 200 in accordance with the first embodiment. In step S100, a designing process is executed by engineers. The designing process includes a step of selecting the digital-to-analog converter chip.

Figure 8:
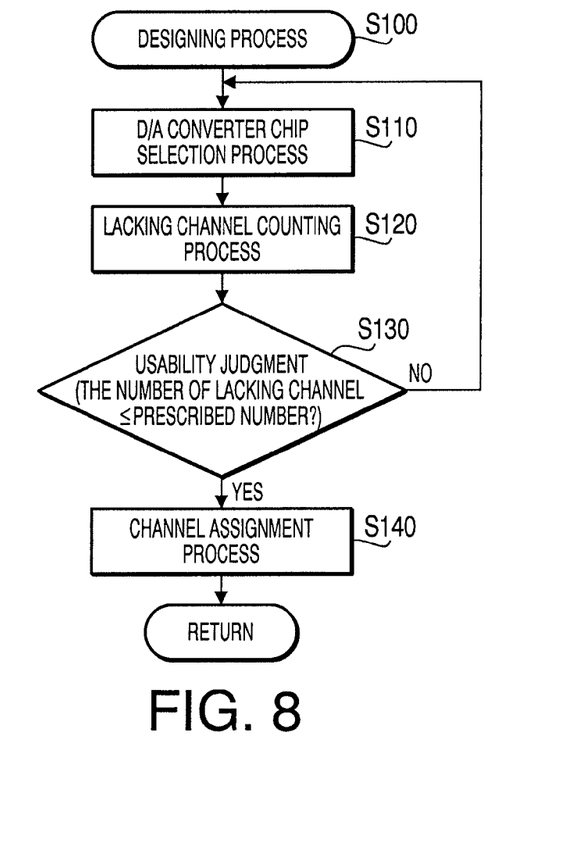
FIG. 8 is a flow chart showing the process flow of a designing process for designing the high-voltage power supply of the first embodiment.

FIG. 8 is a flow chart showing the process flow of the designing process (S100) for designing the high-voltage power supply 200 of the first embodiment. In step S100, a digital-to-analog converter chip selection process is executed by the engineers. The digital-to-analog converter chip selection process is a process of studying and examining available digital-to-analog converter chips and selecting one of the available chips.

In the next step S120, a lacking channel counting process is executed by the engineers. The lacking channel counting process is a process of setting the maximum number of digital-to-analog converter chips (within such an extent that the total number of channels of the chips does not exceed the number of required channels) and calculating the number of lacking channels (the number of required channels minus the total number of channels of the maximum number of digital-to-analog converter chips).

For example, when the number of required channels is 17 as mentioned above and an 8-channel digital-to-analog converter chip 212c1 has been selected in the digital-to-analog converter chip selection process (S110), the maximum number of digital-to-analog converter chips is set at two. Since the total number of channels of the two digital-to-analog converter chips is 16, the number of lacking channels is calculated as 17−16=1.

In the next step S130, a usability judgment is made by the engineers. The usability judgment is a process of judging whether the digital-to-analog converter chip selected in the digital-to-analog converter chip selection process (S110) is usable or not. The usability judgment is made by judging whether or not the number of lacking channels is less than or equal to a "prescribed number" which has been set previously.

In this embodiment, the "prescribed number" has been set at the number of circuits included in the cleaning power circuit group 222 (=5) since the five circuits in the cleaning power circuit group 222 are capable of satisfying the requirements regarding the response delay (as the required power supply specifications) in this embodiment even with the control system using the PWM signal as mentioned above. It should be noted that the "prescribed number" may be set to 16 which is the total number of channels the digital-to-analog converter chips 212.

If the number of lacking channels is less than or equal to the prescribed number (S130: YES), the process advances to step S140, otherwise (S130: NO) the process returns to the step S110.

In the step S140, a channel assignment process is executed by the engineers. The channel assignment process includes two steps. In the first step, a power circuit for using the PWM signal (i.e. using the analog control signal deriving from the PWM signal) is selected from the five circuits of the cleaning power circuit group 222. In the second step, the seventeen channels of analog control signals (outputs of the control circuit 210) are assigned to the seventeen power circuits of the power circuit 220, respectively. The selection of the power circuit for using the PWM signal is made by selecting a power circuit whose required standard regarding the response (response delay) is the lowest among the five circuits, for example.

In this embodiment, the shunt circuit 222Bs is selected (as the power circuit having the lowest required standard regarding the response) from the belt cleaning power circuit 222B (see FIG. 5) which is used for the belt cleaning not directly affecting the image quality, for example. The shunt circuit 222Bs is selected because its required specifications regarding the response can be regarded to be especially low since response characteristics of a shunt circuit (generating electric power by dividing electric power (voltage) of another power circuit) are easily affected and deteriorated by transient response of the other power circuit.

After the channel assignment process is finished as above, the designing process of FIG. 8 (S100 in FIG. 7) is ended and the process advances to step S200 in FIG. 7.

In the step S200, a digital-to-analog converter connecting process is executed by a worker. In the digital-to-analog converter connecting process, the channels of the digital-to-analog converter 212 are connected to the twelve circuits of the electrophotographic process power circuit group 221 and the four circuits of the cleaning power circuit group 222 according to the channel assignment which has been set in the channel assignment process (S140).

In the next step S300, a demodulation circuit connecting process is executed by the worker. In the demodulation circuit connecting process, the demodulation circuit 214 is connected to one circuit (shunt circuit 222Bs) of the cleaning power circuit group 222 according to the channel assignment which has been set in the channel assignment process (S140).

As above, in the manufacturing method in the first embodiment, the control circuit is connected with the power circuit so that all the channels of the digital-to-analog converter 212 are used for generating the analog control signals while restricting the number of demodulation circuits demodulating the PWM signal (i.e. the number of power circuits for using the analog control signals deriving from the PWM signal) within the prescribed number. Therefore, the manufacture of a power supply having high control performance can be realized efficiently through the effective use of the digital-to-analog converter and the demodulation circuit(s). Since the total number of the channels of the digital-to-analog converter is greater than the number of the demodulation circuits, significant effects such as high responsiveness characteristics of the power supply, and downsizing of the entire circuit by reducing the number of the demodulation circuits making use of the characteristic of the digital-to-analog converter that multi-channelization can be done easily. Further, since the generation of electromagnetic waves due to PWM signals can be suppressed, interference of the electro-magnetic waves can also be suppressed. Furthermore, the number of the channels, which are selected as, among required specifications for the power of all the channels, at least one of the response time, dynamic range, and accuracy of the voltage is relatively ease, is set to the upper limit of the control number. Therefore, by recognizing the characteristics showing significant difference of performances of the digital-to-analog circuits and demodulation circuits, it becomes possible to distinctly and appropriately use the digital-to-analog conversion circuits and the demodulation circuits. Incidentally, it is preferable that the number of the channels which are selected as, among required specifications for the power of all the channels, at least one of the response time, dynamic range, and accuracy of the voltage is relatively ease, is equal to or less than the total number of the channels of the digital-to-analog conversion circuit.

Such an efficient design principle for a power supply has been created by the present inventors based on the following knowledge and findings:

(1) The control using a digital-to-analog converter is superior to the control using a demodulation circuit from the viewpoint of the required power supply specifications (response, etc.), while also having upward compatibility with the control using a demodulation circuit.

(2) The control using a demodulation circuit causes substantially no performance deterioration of the power supply control device as long as it is used for controlling electric power that well satisfies the required power supply specifications even with the use of the demodulation circuit (among the multiple channels of electric power as the targets of control).

The present inventors have created the simple manufacturing method realizing high control performance through the effective use of the digital-to-analog converter and the demodulation circuit(s), by focusing on the number of channels of control using the demodulation circuit(s) and restricting the number based on the above knowledge and findings.

Specifically, when the "prescribed number" is five in the control of a power circuit for supplying nineteen channels of electric power, for example, a configuration employing one digital-to-analog converter having eighteen channels, a configuration employing three digital-to-analog converters having six channels, etc. are implementable. In such configurations, in the five channels of electric power control in which substantially no performance deterioration is caused even with the use of the demodulation circuit, one demodulation circuit is used for a channel of electric power control and the digital-to-analog converter (having the upward compatibility) is used for the remaining four channels of electric power control.

As described above, with the manufacturing method in accordance with the first embodiment of the present invention, the manufacture of a power supply control device having high control performance can be realized with ease by making the effective use of the digital-to-analog converter and the demodulation circuit(s) by taking advantage of the design flexibility based on the compatibility between the digital-to-analog converter and the demodulation circuit, just by previously setting the upper limit of the number of channels of electric power control for which the demodulation circuit(s) can be used.

F. Configuration of Power Supply in Accordance with Second Embodiment

Figure 9:
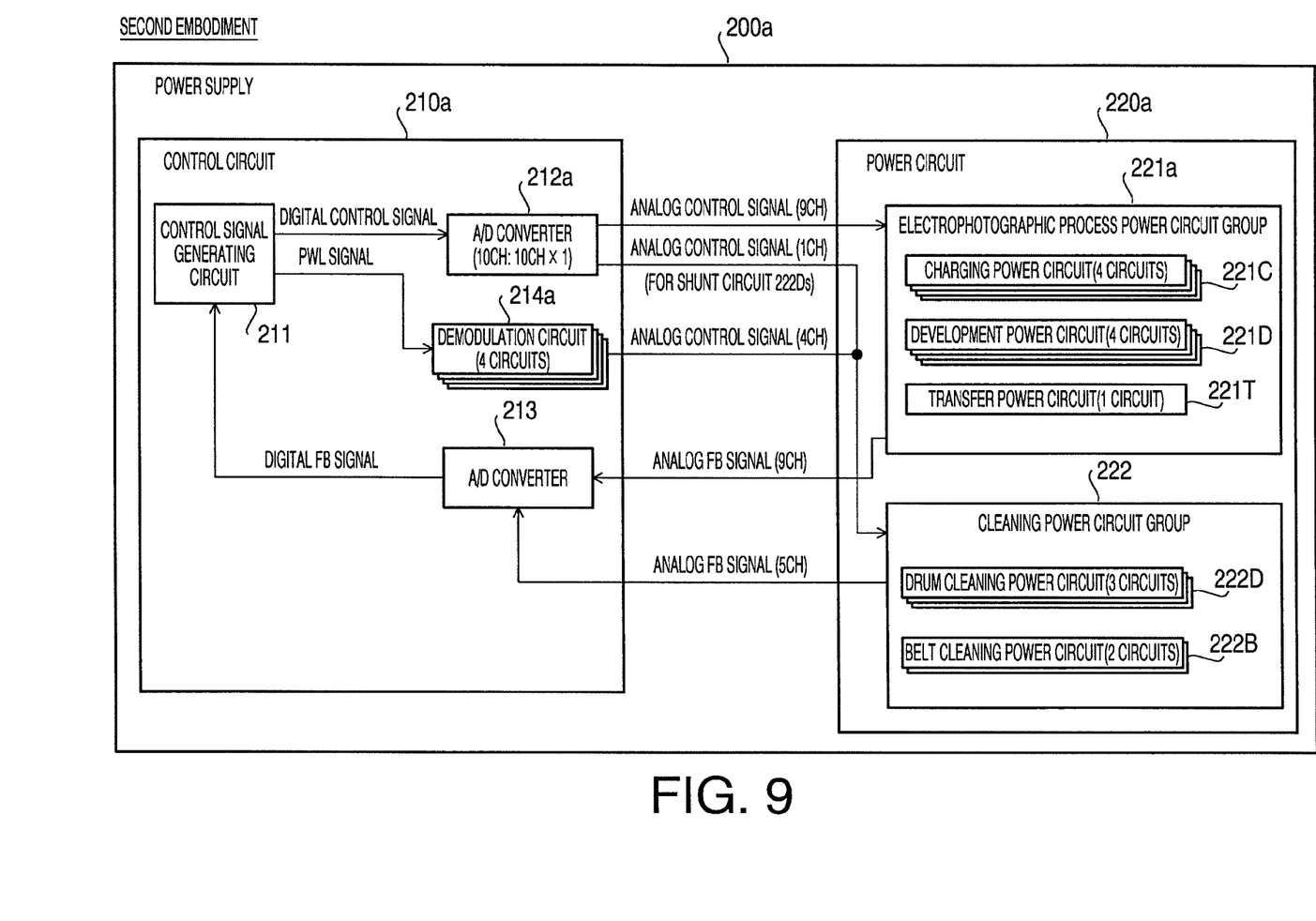
FIG. 9 is a block diagram showing the configuration of a high-voltage power supply in accordance with a second embodiment of the present invention.

FIG. 9 is a block diagram showing the configuration of a high-voltage power supply 200a in accordance with a second embodiment of the present invention. The high-voltage power supply 200a (second embodiment) differs from the high-voltage power supply 200 (first embodiment) in that the target of control has been changed from the power circuit 220 (first embodiment) to a power circuit 220a (second embodiment) and the digital-to-analog converter 212 and the demodulation circuit 214 in the control circuit 210 (first embodiment) have been replaced with a digital-to-analog converter 212a and four demodulation circuits 214a, respectively.

The power circuit 220a differs from the power circuit 220 in the first embodiment in that the number of transfer power circuits 221T has been reduced from four to one. Such a configuration change is possible when one transfer power circuit 221T is capable of supplying electric power sufficient for the loads of the four transfer rollers 126C, 126M, 126Y and 126K, for example.

In the second embodiment, the configuration of the control circuit 210 in the first embodiment is changed to a configuration (control circuit 210a) shown in FIG. 9 in response to the above configuration change of the target of control. Such a configuration change can be carried out through the designing process (S100) shown in FIG. 8 similarly to the first embodiment.

In the digital-to-analog converter chip selection process (S110 in FIG. 8), a 10-channel digital-to-analog converter chip 212a is selected. Such selection is made since the number of channels required of the digital-to-analog converter 212a has decreased from seventeen to fourteen due to the decrease (three channels) in the number of channels required of the electrophotographic process power circuit group 221 (221a).

In the lacking channel counting process (S120), the number of lacking channels is calculated as four by subtracting the number of channels of the digital-to-analog converter 212a (ten) from the number of required channels (fourteen).

In the usability judgment (S130), the digital-to-analog converter chip (10-channel digital-to-analog converter chip 212a) selected in the digital-to-analog converter chip selection process (S110) is judged to be usable since the number of lacking channels (four) is less than or equal to the "prescribed number" (five) which has been set previously as explained above.

In the channel assignment process (S140), four power circuits are selected as follows: The toner removal charging power circuit 222D1 and the paper dust removal charging power circuit 222D2 of the drum cleaning power circuit 222D and the two circuits (deposit removal charging power circuit 222B1, shunt circuit 222Bs) of the belt cleaning power circuit 222B (see FIG. 5) are selected as four power circuits to be controlled by the PWM signal (i.e. controlled by analog control signals deriving from the PWM signal), while the shunt circuit 222Ds of the drum cleaning power circuit 222D is selected as a circuit to be controlled by the digital control signal (i.e. controlled by an analog control signal deriving from the digital control signal).

Incidentally, the toner removal charging power circuit 222D1 and the paper dust removal charging power circuit 222D2 are designed as circuits having the same configuration except for the polarity (positive/negative) as mentioned above.

Such assignment is carried out in this embodiment based on the following criteria:

First, both of the two circuits (deposit removal charging power circuit 222B1, shunt circuit 222Bs) of the belt cleaning power circuits 222B (see FIG. 5), to be used for belt cleaning (not directly affecting the image quality), are selected as circuits to be controlled by the PWM signal.

Second, the toner removal charging power circuit 222D1 and the paper dust removal charging power circuit 222D are selected from the three circuits of the drum cleaning power circuit 222D (toner removal charging power circuit 222D1, paper dust removal charging power circuit 222D2, shunt circuit 222Ds) as the remaining two circuits to be controlled by the PWM signal. This selection is made for realizing commonality of the control method in consideration that the toner removal charging power circuit 222D1 and the paper dust removal charging power circuit 222D2 are equivalent power circuits except for the polarity (positive/negative).

The commonality of the control method leads to commonality of dynamic characteristics of the two circuits 222D1 and 222D2, by which the design of the cleaning power circuit group 222 can be simplified and its reliability can be increased. As above, the channel assignment process (S140) may be executed prioritizing the commonality of circuitry over the type of each power circuit (e.g. shunt circuit).

As described above, by the second embodiment of the present invention, the design tasks from the selection of the digital-to-analog converter chip to the channel assignment can be carried out with extreme ease in response to the design change of the power circuit (target of control).

Incidentally, the channel assignment process (S140) is not to be restricted to the above assigning method but can be executed according to various methods. For example, it is possible to assign the priority regarding the connection with the demodulation circuit(s) successively to power circuits selected based on their response time (successively from a power circuit having the longest response time). With this assigning method, the control by the PWM signal (i.e. the control using the demodulation circuit(s)) is employed preferentially for power circuits having long response time (successively from the power circuit having the longest response time), by which deterioration of the control performance (response characteristics) of the power supply can be reduced to a minimum.

In the above embodiments, the number (M) of channels of the digital-to-analog converter is less than the number (N) of demodulation circuits. Such a configuration is remarkably advantageous in that the response characteristics of the power supply control device can be improved as a whole while reducing the number of demodulation circuits (taking advantage of the character of the digital-to-analog converter facilitating the increasing of the number of channels) and thereby reducing the circuit scale of the whole device. Further, electromagnetic interference can be suppressed by reducing electromagnetic waves caused by the transmission of the PWM signal.

In the above embodiments, the components of the printer 1 (image formation device) include multiple charging units 122C, 122M, 122Y and 122K (charging circuits) having substantially the same electrical configurations, and the control circuit (210, 210a) as the power supply control device controls all channels of electric power supplied from the power circuit (220, 220a) to the multiple charging circuits by exclusively using the digital-to-analog converter (or by exclusively using the demodulation circuits). With such a configuration, all of the equivalent components (having substantially the same electrical configurations) can be controlled exclusively using the digital-to-analog converter or the demodulation circuits, by which the configuration can be simplified while also increasing the reliability through commonality of the method of controlling the equivalent components.

G. Modifications

While a description has been given above of preferred embodiments in accordance with the present invention, the present invention is not to be restricted by the particular illustrative embodiments and a variety of modifications, design changes, etc. are possible without departing from the scope and spirit of the present invention described in the appended claims.

G-1. Modification 1

While a power supply which supplies multiple channels of electric power to multiple loads in an image formation device has been described as an example in the above embodiments, the present invention is widely applicable to power supplies for supplying multiple channels of electric power such as a power supply for a server.

G-2. Modification 2

While the power circuits are classified into groups based on their purposes (electrophotographic process, cleaning, etc.) and the "prescribed number" is set at the number of power circuits for the purpose of cleaning in the above embodiments, the "prescribed number" may be set differently. For example, the "prescribed number" may be set at the number of power circuits that are selected since at least one of their response time, dynamic range and voltage accuracy is relatively lax. Here, "lax" means "long" for the response time, "narrow" for the dynamic range and "low" for the voltage accuracy.

G-3. Modification 3

While the setting of the "prescribed number" and the channel assignment are made in the above embodiments based on the aforementioned criteria such as the purpose of each circuit (electrophotographic process, cleaning, etc.), the type of each circuit (shunt circuit, etc.) and the identity (commonality) of circuitry, the setting of the "prescribed number" and the channel assignment may be made based on various criteria. For example, the channel assignment to the control using the demodulation circuit(s) may also be made based on whether each component (e.g. power circuit) is an individual component (having an electrical configuration different from those of the other components) or not.

With the above criterion, each individual component (having an electrical configuration unique among the components) can be connected to each of N demodulation circuits (N: positive integer which can be set (increased/decreased) freely), by which the freedom of configuration can be increased remarkably in the manufacture of the power supply control device.

G-4. Modification 4

In the above-described embodiments, if the digital-to-analog converter includes multiple digital-to-analog converter chips, each having multiple digital-to-analog conversion circuits, the digital-to-analog converter chips have the same number of channels (i.e., the multiple digital-to-analog converter chips have the same number of digital-to-analog conversion circuits). However, this can be modified such that the multiple digital-to-analog converter chips having different numbers of digital-to-analog conversion circuits may be employed.

However, by use of multiple digital-to-analog converter chips having the same number of digital-to-analog conversion circuits, the reliability of the control can be increased through employment of common control logic for the multiple digital-to-analog converter chips.

The present invention is implementable in various forms such as a power supply control device, a power supply including the power supply control device, an image formation device equipped with the power supply, an expert system for supporting the designing of such an image formation device, and a program or program product for implementing the expert system.

What is claimed is:

1. A power supply for supplying electric power, comprising:
    a power circuit which supplies L channels of electric power (L: positive integer);
    a control circuit which outputs multiple types of control signals including a digital control signal and a PWM signal;
    a digital-to-analog converter having M channels (M: positive integer less than L) each of which converts the digital control signal into an analog control signal; and
    N demodulation circuits (N=L−M) each of which generates an analog control signal by demodulating the PWM signal, wherein:
    the control circuit is electrically connected to the power circuit via the M channels of the digital-to-analog converter and the N demodulation circuits, and
    N is a positive integer not more than M.

2. The power supply according to claim 1, wherein:
    the L channels of electric power include P channels of electric power (P: positive integer) that have been selected since at least one of response time, dynamic range and voltage accuracy of the electric power, included in power supply specifications regarding the L channels of electric power, is relatively lax, and N is not more than P.

3. The power supply according to claim 1, wherein
the digital-to-analog converter includes multiple digital-to-analog conversion ICs each having multiple digital-to-analog conversion circuits, and
the digital-to-analog conversion ICs have the same number of digital-to-analog conversion circuits.

4. The power supply according to claim 1, wherein
the power circuit supplies the L channels of electric power to components of an image formation device which forms an image on a print medium according to image data, and
the components of the image formation device include at least one component whose response time as a required power supply specification differs from those of the other components, and
channels successively selected from the L channels of electric power in descending order of the response time of the corresponding component are preferentially assigned to the control using the demodulation circuits.

5. The power supply according to claim 4, wherein:
the components of the image formation device include a dust adsorbing roller charging circuit which electrically charges a dust adsorbing roller which adsorbs dust that has come off from the print medium by use of electrostatic force, and
the electric power supplied from the power circuit to the dust adsorbing roller charging circuit is controlled by use of the demodulation circuit.

6. The power supply according to claim 5, wherein:
the power circuit includes multiple power circuits such as a first power circuit which generates first voltage and a second power circuit which generates second voltage based on the first voltage, and
the second power circuit is controlled by use of the demodulation circuit.

7. The power supply according to claim 4, wherein:
the components of the image formation device include a particular component having an electrical configuration differing from those of the other components, and
the electric power supplied from the power circuit to the particular component is controlled by use of the demodulation circuit.

8. The power supply according to claim 4, wherein:
the components of the image formation device include multiple charging circuits having substantially the same electrical configurations, and
all channels of electric power supplied from the power circuit to the multiple charging circuits are controlled by exclusively using the digital-to-analog converter or by exclusively using the demodulation circuits.

9. A power supply control device which controls a power circuit which supplies L channels of electric power (L: positive integer), comprising:
a control signal generating circuit which outputs multiple types of control signals including a digital control signal and a PWM signal;
a digital-to-analog converter having M channels (M: positive integer less than L) each of which converts the digital control signal into an analog control signal; and
N demodulation circuits (N=L−M) each of which generates an analog control signal by demodulating the PWM signal, wherein:

the M channels of the digital-to-analog converter and the N demodulation circuits to be connected to the power circuit are electrically connected with the control signal generating circuit, and
N is a positive integer not more than M.

10. The power supply control device according to claim 9, wherein:
the L channels of electric power include P channels of electric power (P: positive integer) that have been selected since at least one of response time, dynamic range and voltage accuracy of the electric power, included in power supply specifications regarding the L channels of electric power, is relatively lax, and
N is not more than P.

11. The power supply control device according to claim 9, wherein
the digital-to-analog converter includes multiple digital-to-analog conversion ICs each having multiple digital-to-analog conversion circuits, and
the digital-to-analog conversion ICs have the same number of digital-to-analog conversion circuits.

12. The power supply control device according to claim 9, wherein
the power circuit supplies the L channels of electric power to components of an image formation device which forms an image on a print medium according to image data, and
the components of the image formation device include at least one component whose response time as a required power supply specification differs from those of the other components, and
the power supply control device is configured so that channels successively selected from the L channels of electric power in descending order of the response time of the corresponding component are preferentially assigned to the control using the demodulation circuits.

13. A manufacturing method of a power supply having a power circuit which supplies L channels of electric power (L: positive integer), comprising:
a preparation step of preparing a control circuit which outputs multiple types of control signals including a digital control signal and a PWM signal, a digital-to-analog converter having M channels (M: positive integer less than L) each of which converts the digital control signal into an analog control signal, and N demodulation circuits (N=L−M) each of which generates an analog control signal by demodulating the PWM signal;
a first connecting step of electrically connecting the M channels of the digital-to-analog converter to be connected to the power circuit with the control circuit board; and
a second connecting step of electrically connecting the N demodulation circuits to be connected to the power circuit with the control circuit board,
wherein N is a positive integer not more than M.

14. The manufacturing method according to claim 13, wherein:
the L channels of electric power include P channels of electric power (P: positive integer) that have been selected since at least one of response time, dynamic range and voltage accuracy of the electric power, included in power supply specifications regarding the L channels of electric power, is relatively lax, and
N is not more than P.

15. The manufacturing method according to claim 13, wherein
the digital-to-analog converter includes multiple digital-to-analog conversion ICs each having multiple digital-to-analog conversion circuits, and
the digital-to-analog conversion ICs have the same number of digital-to-analog conversion circuits.

16. The manufacturing method according to claim 13, wherein:
the power circuit supplies the L channels of electric power to components of an image formation device which forms an image on a print medium according to image data, and
the components of the image formation device include at least one component whose response time as a required power supply specification differs from those of the other components, and
the power supply control device is configured so that channels successively selected from the L channels of electric power in descending order of the response time of the corresponding component are preferentially assigned to the control using the demodulation circuits.

* * * * *